United States Patent [19]
Tomassetti et al.

[11] Patent Number: 5,043,677
[45] Date of Patent: Aug. 27, 1991

[54] TIME REFERENCE SIGNAL GENERATION SYSTEM

[75] Inventors: Stephen R. Tomassetti, Lewisville; Alan T. Wetzel, Parker; Khodor S. Elnashar, Richardson; Rich A. Rochelle, Carrollton, all of Tex.

[73] Assignee: Texas Instruments Incorporated, Dallas, Tex.

[21] Appl. No.: 546,135

[22] Filed: Jun. 29, 1990

[51] Int. Cl.$^5$ .............................. H03L 7/085
[52] U.S. Cl. ............................ 331/2; 331/17; 331/18; 331/36 C
[58] Field of Search .............. 331/2, 17, 18, 23, 25, 331/36 C, 60

[56] References Cited

U.S. PATENT DOCUMENTS 4,667,168  5/1987  Shiomi et al. .................. 331/2 X
4,904,955  2/1990  Ley ................................... 331/2

Primary Examiner—David Mis
Attorney, Agent, or Firm—B. Peter Barndt; James T. Comfort; Melvin Sharp

[57] ABSTRACT

A reference time signal generation system 10 is provided which comprises a phase lock loop circuit 12 which generates a reference voltage $V_m$. The phase lock loop circuit 12 comprises first and second divider circuits 14 and 18 coupled to the input of a phase comparator 16. The output of the phase comparator 16 is coupled to a loop filter 20 which generates a DC representation of the phase differential of the inputs of the phase comparator 16. The output of the loop filter 20 is input into a bias generator 26. The output of the bias generator 26 is coupled to the input of a voltage controlled oscillator 28 which has its output coupled to the input of second divider circuit 18. The reference voltage signal $V_m$ is taken from the output of the bias generator 26 and is transmitted to remote timing elements 32, 34 and 36 where it may be used to create reference timing signals which will accurately track the reference clock signal input into phase lock loop circuit 12.

26 Claims, 1 Drawing Sheet

TIME REFERENCE SIGNAL GENERATION SYSTEM

TECHNICAL FIELD OF THE INVENTION

This invention relates in general to the field of integrated electronic circuits and more particularly, the present invention relates to a system for providing time reference signals to remote circuits on an integrated circuit.

BACKGROUND OF THE INVENTION

Precision control of timing elements such as delay elements, oscillators and one shots is a typical design requirement in digital and analog integrated circuits. There are two common methods of providing for the precise control of such timing elements. The first method uses conventional digital synchronization of the elements with an external reference clock signal. The second technique uses precision components such as resistors and capacitors to set up a time constant. Both of these techniques have severe limitations for the integrated circuit environment.

A typical application of the digital technique of synchronization would be to gate an event such as an incoming pulse with another timing pulse whose period is set to an integer multiple of the reference clock. The drawbacks of this method are that the controlling pulse can only be an integer multiple of the reference clock. This problem can only be mitigated by using an extremely high frequency reference clock so that a "one clock cycle" error is insignificant relative to the event being gated.

Significant difficulties arise using the analog approach as well. Precise control of the values of resistors, inductors and capacitors have not been achieved in high volume semi-conductor techniques which are common to integrated circuit implementation. The precision of the synchronization of various elements within the integrated circuit is directly related to the precision of the value of the aforementioned components. Precise control of the values of these elements can only be achieved via laser trimming of on-chip components or through the use of external components. Both of these methods are extremely expensive when compared to normal semi-conductor processing costs.

Accordingly, a need has arisen for a system which can provide time reference signals to remote locations on an integrated circuit chip which does not require extremely high frequency reference clock signals, precision external timing components or precision adjustment of internal components via laser trimming or other methods.

SUMMARY OF THE INVENTION

In accordance with the present invention, a time reference signal generation system is provided which significantly eliminates or reduces disadvantages and problems associated with the previously discussed systems for providing synchronization or internal components of an integrated circuit. In accordance with the present invention, a phase lock loop is coupled to an external reference clock signal. The phase lock loop generates a reference voltage responsive to the reference clock signal. This reference voltage is transmitted to remote timing elements which comprise components which are matched to the components of the phase lock loop. By proportionately matching the values of the components of the remote timing elements, the remote timing elements can be synchronized with the external reference clock signal.

In accordance with one embodiment of the present invention, the phase lock loop generator comprises a voltage controlled oscillator, a phase comparator and a loop filter. The phase comparator compares the external reference clock signal to the signal output by the voltage controlled oscillator. The phase differential between these two signals is output to a loop filter which integrates the signal output by the phase comparator and outputs a DC characterization of that signal. The DC characterization output by the loop filter is input into a bias generator which outputs the reference voltage signal which is transmitted to the remote timing elements.

An important technical advantage of the present invention inheres in the fact that the use of a analog reference signal as a function of an external clock signal allows for the non-integer scaling of timing signals throughout an integrated circuit. The components comprising the remote timing elements can be scaled at any value proportional to the components comprising the phase lock loop used to generate the analog reference signal. As such, the synchronization signals output by the remote timing elements can be any integer or non-integer multiple of the external clock signal. This allows much greater freedom for a circuit designer who can achieve any duration synchronization signal merely through the appropriate relative sizing of components in an external timing element and in the phase lock loop. In addition, remote timing elements constructed according to the teachings of the present invention may be asynchronous to the reference clock signal and to other remote timing elements.

BRIEF DESCRIPTION OF THE DRAWINGS

A more complete understanding of the present invention may be acquired by referring to the detailed description and claims when considered in connection with the accompanying drawings in which like reference numbers indicate like features, and wherein:

DETAILED DESCRIPTION OF THE INVENTION

Figure 1:
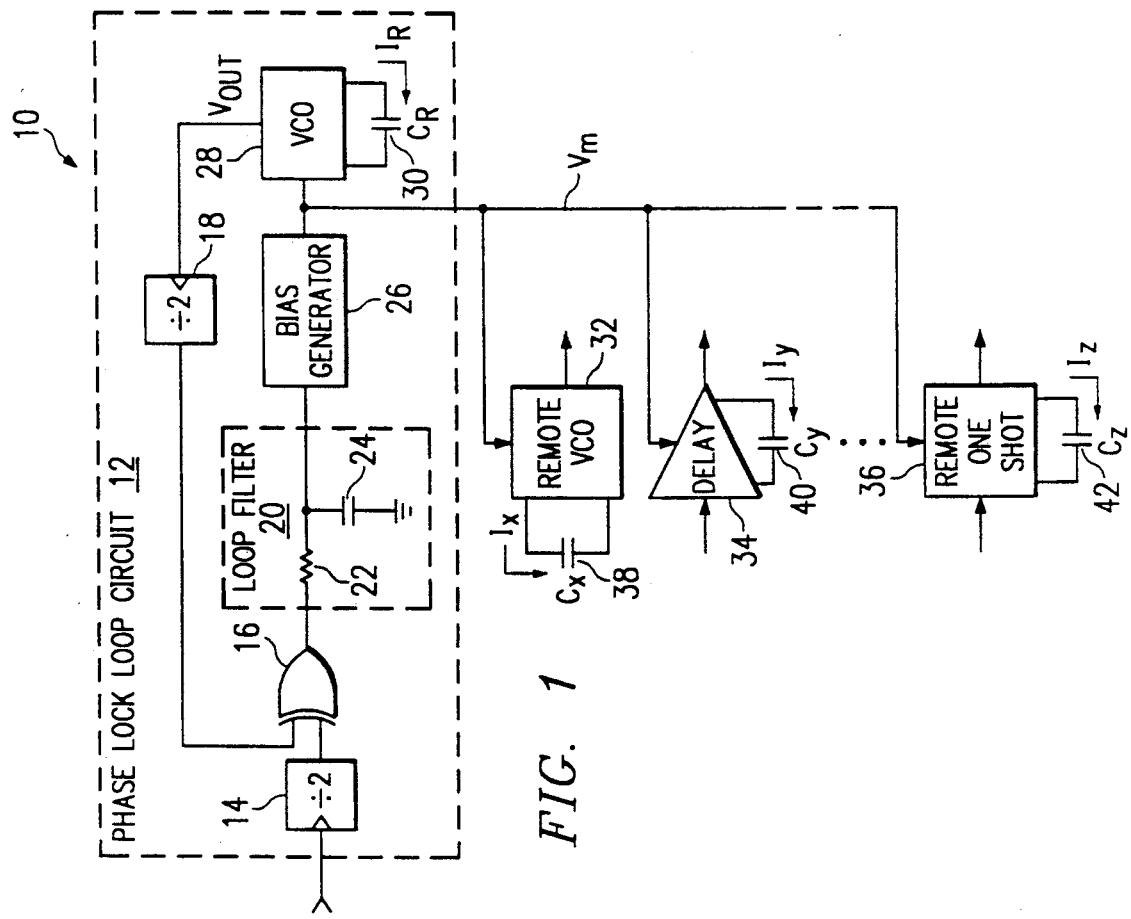
FIG. 1 is a schematic block diagram of one embodiment of the system of the present invention.

Referring to FIG. 1, a system indicated generally at 10 is shown to comprise a phase lock loop circuit 12. Phase lock loop circuit receives an external clock signal, $T_R$ which may comprise, for example, a 10 megahertz square wave clock signal. The $T_R$ signal is input into a first divider 14 whose output is coupled to the input of a phase comparator 16 which may comprise, for example, an exclusive-OR gate. Phase comparator 16 has its other input coupled to the output of a second divider 18. The output of phase comparator 16 is coupled to the input of a loop filter 20. Loop filter 20 may comprise, for example, an RC network comprising a resistor 22 and a capacitor 24. The output of loop filter 20 is transmitted to the input of a bias generator circuit 26. The output of the bias generator circuit 26 is input into a voltage controlled oscillator 28. Voltage controlled oscillator 28 may comprise a reference capacitor 30 having a capacitive value of $C_R$. One possible embodiment of voltage controlled oscillator 28 will be discussed more fully with reference to FIG. 2. The output of voltage controlled oscillator 28 is labelled $V_{out}$ and is coupled to the input of second divider 18. The output of the bias generator 26 and the input of the voltage controlled oscillator 28 is a reference voltage signal which is labelled $V_M$ which is the output signal from the phase lock loop circuit 12.

The reference voltage $V_M$ may be transmitted throughout an integrated circuit chip to a variety of remote timing elements. The reference voltage $V_M$ is shown in FIG. 1 to be routed to a remote voltage controlled oscillator 32, a remote delay element 34 and a remote one-shot element 36. Remote voltage control oscillator 32 may comprise a scaling capacitor 38 which may have a capacitive value of $C_x$. Similarly, remote delay element 34 may have a scaling capacitor 40 having a capacitive value of $C_Y$ and remote one-shot element 36 may have a scaling capacitor 42 having a capacitive value of $C_z$.

In operation, phase lock loop circuit 12 receives the reference clock signal $T_R$ and will effectively translate the frequency of that signal into a DC voltage representation of that signal. This DC voltage representation is the reference voltage, $V_M$. To accomplish this function, first and second dividers 14 and 18 are used to ensure that the signals input into phase comparator 16 have identical wave shapes and duty cycles.

The signals being input into phase comparator 16 are ordinarily out of phase. As such, phase comparator 16 outputs a series of pulses to loop filter 20 representing the time periods when the signals at the inputs of phase comparator 16 have differing voltage levels. Loop filter 20 effectively integrates the series of pulses converting them to a DC voltage value which is input into bias generator 26. Bias generator 26 incorporates a DC voltage level shift into the signal received from loop filter 20. Additionally, bias generator 26 may filter the DC voltage signal and supply a start-up voltage bias so that the remote timing elements coupled to the phase lock loop circuit 12 can function prior to the stabilization of the external reference clock signal $T_R$. The reference voltage $V_M$ is input into the voltage controlled oscillator 28 which outputs a responsive square wave signal, $V_{out}$ through second divider 18 into phase comparator 16. In this manner, a negative feedback loop is established and reference voltage signal $V_M$ will stabilize at a DC voltage level which will track the frequency of the external clock signal $T_R$.

Figure 2:
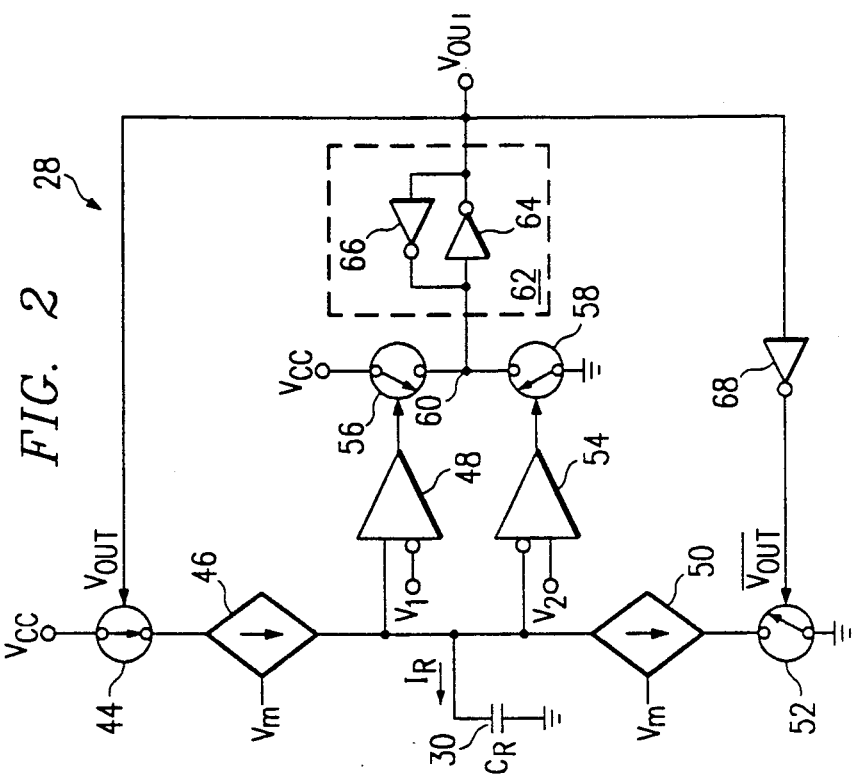
FIG. 2 is a schematic diagram of a voltage controlled oscillator which may be used in one embodiment of the system of the present invention.

Referring to FIG. 2, a schematic illustration of one possible embodiment of voltage control oscillator 28 is shown. Voltage control oscillator 28 may comprise a first controlled switch 44 which selectively couples a supply voltage $V_{cc}$ to the input of a dependent current source 46. Dependent current source 46 is coupled to the reference voltage signal $V_M$. The output of dependent current source 46 is coupled to a non-inverted input of a first comparator 48. The output of dependent current source 46 is also coupled to a first node of the reference capacitor 30 which has its second node coupled to ground potential. The output of dependent current source 46 is also coupled to the input of a second dependent current source 50 which is similarly coupled to the reference voltage $V_M$. The output of second dependent current source 50 is coupled to a second controlled switch 52 which selectively couples the output of dependent current source 50 to ground potential.

The input of second controlled current source 50 and the output of first controlled current source 46 are also coupled to a first inverted input of a second comparator 54. The inverted input of first comparator 48 is coupled to a first comparator reference voltage $V_1$. The non-inverted input of second comparitor 54 is coupled to a second comparator reference voltage $V_2$. The output of first comparator 48 controls the opening and closing of a third controlled switch 56. The output of second comparator 54 similarly controls the opening and closing of a fourth controlled switch 58.

Third controlled switch 56 selectively couples a node 60 to the $V_{cc}$ supply voltage. Fourth controlled switch 58 similarly selectively couples node 60 to ground potential. Node 60 is coupled to the input of a latch circuit 62 which may comprise first and second invertors 64 and 66 coupled as shown in FIG. 2. The output of latch circuit 62 comprises the $V_{out}$ signal which directly controls the opening and closing of first controlled switch 44. The $V_{out}$ signal is additionally input into a third invertor 68 which generates the inverse $V_{out}$ signal to control the opening and closing of second controlled switch 52. As discussed with reference to FIG. 1, the $V_{out}$ signal is also input into second divider 18 which subsequently inputs the divided $V_{out}$ signal into phase comparator 16.

In operation, voltage controlled oscillator circuit 28 receives an input reference voltage $V_M$ and through the charging and discharging of reference capacitor 30, generates a square wave output signal $V_{out}$. The operation of voltage controlled oscillator 28 is best described if a preliminary assumption is made that the first, second, third and fourth controlled switches 44, 52, 56 and 58 are configured in the manner shown in FIG. 2. In this condition, the reference capacitor 30 is in its charging mode as it is coupled through dependent current source 46 to the supply voltage $V_{cc}$. Reference capacitor 30 will continue to charge until the voltage across reference capacitor 30 reaches the value of first comparator reference voltage $V_1$. At this point, comparator 48 will output a high signal which will close third controlled switch 56. This will cause latch circuit 62 to flip such that the output voltage $V_{out}$ will go to a low state causing first controlled switch 44 to open and second control switch 52 to close. Accordingly, reference capacitor 30 will begin to discharge until the value across reference capacitor 30 reaches the value of the second comparator reference voltage $V_2$. At this point, comparator 54 will cause fourth controlled switch 58 to close once again causing the latch circuit 62 to flip. This will cause $V_{out}$ to reenter a high state causing first controlled switch 44 to close and second controlled switch 52 to open. This will once again begin the charging of reference capacitor 30.

In a specific embodiment of voltage controlled oscillator 28, the controlled switches shown schematically in FIG. 2 may comprise a variety of electronic components. For example, controlled switches 44, 52, 56 and 58 may comprise bipolar transistors, MOSFETs or equivalent technology. Similarly, dependent current sources 46 and 50 may comprise any voltage controlled current source constructed using any number of semiconductor technologies such as bipolar CMOS, Bi-CMOS or MOS technology.

In operation, the system of the present invention converts an external reference clock signal to a voltage domain reference signal which may be transmitted to remote timing elements. By using conventional current mirroring techniques, the reference voltage signal can be used in the remote timing elements to create proportional reference currents within these elements. Additionally, known techniques can be used to construct reference elements within the remote timing elements which can accurately track and match elements within the phase lock loop circuit 12. For example, referring to FIG. 1, similar process techniques can be used to construct reference capacitor 30 and reference capacitors 38, 40 and 42. Accordingly, any proportional value of $C_R$ could be selected for $C_x$, $C_Y$ and $C_Z$. By tying the remote elements 32, 34 and 36 to the $V_M$ reference signal, the operation of the remote timing elements will directly track the variations in frequency of the reference clock signal $T_R$. Accordingly, timing and synchronization functions can be accomplished remotely within an integrated circuit by tying the remote timing elements to the $V_M$ reference signals.

Further, infinitely variable selection of the remote timing signals is possible because the sizing of the reference elements such as reference capacitors 38, 40 and 42 within the remote timing elements can be non-integer multiples of the reference element within the phase lock loop circuit 12. This allows for analog selection of the periods of remote timing signals without the use of precision external components and without the error associated with the strictly digital approach of gating off of the external clock source.

Although specific implementations of the remote voltage controlled oscillator 32, the remote delay element 34 and the remote one-shot element 36 have not been shown, these elements may be constructed according to known methods to utilize the reference voltage signal $V_M$ and may be constructed using similar circuit and chip topography as voltage controlled oscillator 28 such that process, temperature and other considerations which effect variations in the operational characteristics of voltage controlled oscillator 28 will similarly affect the remote timing elements. The reference voltage $V_M$ can thus be used to drive current mirrors within these remote elements to track process temperature and other considerations simultaneously affecting voltage controlled oscillator 28 within phase lock loop circuit 12. In this manner, the timing signals generated by the remote timing elements may be made to be solely and directly proportional to the selected relative sizing of the reference capacitors in the remote elements and in the voltage controlled oscillator 28. The timing signals may be selectively made to be asynchronous to the reference clock signal or to other remote timing elements while maintaining infinitely variable and accurate time scaling with respect to the reference clock signal. Precision control and infinitely variable timing signals are thus made available throughout an integrated circuit chip merely by the routing of the reference voltage signal $V_M$ to remote timing elements throughout the chip.

In addition, the elements within the remote timing elements which correspond to dependent current sources 46 and 50 can be scaled using known methods to achieve continuous variability of time signal scaling within the remote timing elements. The reference voltage within the remote timing elements corresponding to $V_1$ and $V_2$ can also similarly be scaled to provide further time signal scaling capability.

Although the present invention has been described in detail, it should be understood that various changes, substitutions and alterations can be made hereto without departing from the spirit and scope of the invention as defined by the appended claims.

What is claimed is:

1. A circuit for providing timing signals in an integrated circuit coupled to an external clock signal, comprising:
   a phase lock loop circuit operable to receive the external clock signal and generate an analog reference voltage signal representative of the external clock signal, wherein said phase lock loop comprises:
      a phase comparator having first and second inputs and an output, said first phase comparator input coupled to the external clock signal;
      a loop filter having an input and an output, said loop filter coupled to said phase comparator output, said loop filter operable to receive a phase differential signal from said phase comparator and output a DC voltage signal;
      a bias generator circuit having an input and an output, said bias generator input coupled to said loop filter output, said bias generator circuit operable to receive said DC voltage signal and output said analog reference voltage signal; and
      a voltage controlled oscillator having an input coupled to said reference voltage signal and an output coupled to said second phase comparator input, said voltage controlled oscillator operable to generate a feedback signal to be input into said phase comparator circuit; and
   a remote timing circuit coupled to said reference voltage signal operable to generate a digital timing signal responsive to said reference voltage signal.

2. The circuit of claim 1 wherein said phase comparator circuit comprises an exclusive-OR gate.

3. The circuit of claim 1 wherein said loop filter comprises:
   a resistor coupled between said loop filter input and output; and
   a capacitor coupled between said loop filter output and a predetermined voltage level.

4. The circuit of claim 1 wherein said voltage controlled oscillator comprises a reference capacitor and wherein said remote timing circuit comprises a remote capacitor.

5. The circuit of claim 4 wherein said reference capacitor and said remote capacitor are formed using substantially identical processes such that said capacitors will react equivalently to variances in ambient operating conditions and to variances in said processes.

6. The circuit of claim 1 wherein said phase lock loop circuit further comprises:
   a first divider circuit having an input coupled to the external clock signal and an output coupled to said first phase comparator input; and
   a second divider circuit having an input coupled said voltage controlled oscillator output and an output coupled to said second phase comparator input, said first and second divider circuits operable to generate signals to be input into said phase comparator having substantially identical frequencies and waveforms.

7. The circuit of claim 1 wherein said voltage controlled oscillator comprises a reference dependent current source coupled to said reference voltage signal and wherein said remote timing circuit comprises a remote dependent current source coupled to said reference voltage signal.

8. The circuit of claim 7 wherein said reference dependent current source and said remote dependent current source are formed using substantially identical processes such that said current sources will react equivalently to variances in ambient operating conditions and variances in said processes.

9. The circuit of claim 1 wherein said voltage controlled oscillator comprises a reference comparator circuit coupled to a first predetermined voltage level and wherein said remote timing circuit comprises a remote comparator circuit coupled to a second predetermined voltage level.

10. The circuit of claim 9 wherein said reference comparator circuit and said remote comparator circuit are formed using substantially identical processes such that said comparators will react equivalently to variances in ambient operating conditions and variances in said processes.

11. The circuit of claim 10 wherein said second predetermined voltage level is selectively sized relative to said first predetermined voltage level such that said digital timing signal is selectively sized relative to the external clock signal.

12. An integrated circuit coupled to an external clock signal, comprising:
a phase lock loop circuit operable to receive the external clock signal and generate an analog reference voltage signal representative of the external clock signal, said phase lock loop circuit comprising:
a phase comparator having first and second inputs and an output, said first phase comparator input coupled to the external clock signal;
a loop filter having an input and an output, said loop filter input coupled to said phase comparator output, said loop filter operable to receive a phase differential signal from said phase comparator and output a DC voltage signal;
a bias generator circuit having an input and an output, said bias generator input coupled to said loop filter output, said bias generator circuit operable to receive said DC voltage signal and output said analog reference voltage signal; and
a voltage controlled oscillator having an input coupled to said reference voltage signal and an output coupled to said second phase comparator input, said voltage controlled oscillator operable to generate a feed back signal to be input into said phase comparator circuit; and
a remote timing circuit coupled to said reference voltage signal and operable to generate a digital timing signal responsive to said reference voltage signal.

13. The circuit of claim 12 wherein said phase comparator circuit comprises an exclusive-OR gate.

14. The circuit of claim 12 wherein said loop filter comprises:
a resistor coupled between said loop filter input and output; and
a capacitor coupled between said loop filter output and a predetermined voltage level.

15. The circuit of claim 12 wherein said voltage controlled oscillator comprises a reference capacitor and wherein said remote timing circuit comprises a remote capacitor.

16. The circuit of claim 15 wherein said reference capacitor and said remote capacitor are formed using substantially identical processes such that said capacitors will react equivalently to variances in ambient operating conditions affecting the circuit and variances in said processes.

17. The circuit of claim 12 wherein said phase lock loop circuit further comprises:
a first divider circuit having an input coupled to the external clock signal and an output coupled to said first phase comparator input; and
a second divider circuit having an input coupled to said voltage controlled oscillator output and an output coupled to said second phase comparator input, said first and second divider circuits operable to generate signals to be input into said phase comparator having substantially identical frequencies and waveforms.

18. The circuit of claim 12 wherein said voltage controlled oscillator comprises a reference dependent current source coupled to said reference voltage signal and wherein said remote timing circuit comprises a remote dependent current source coupled to said reference voltage signal.

19. The circuit of claim 18 wherein said reference dependent current source and said remote dependent current source are formed using substantially identical processes such that said current sources will react equivalently to variances in ambient operating conditions and variances in said processes.

20. The circuit of claim 12 wherein said voltage controlled oscillator comprises a reference comparator circuit coupled to a first predetermined voltage level and wherein said remote timing circuit comprises a remote comparator circuit coupled to a second predetermined voltage level.

21. The circuit of claim 20 wherein said reference comparator circuit and said remote comparator circuit are formed using substantially identical processes such that said comparators will react equivalently to variances in ambient operating conditions and variances in said processes.

22. The circuit of claim 21 wherein said second predetermined voltage level is selectively sized relative to said first predetermined voltage level such that said digital timing signal is selectively sized relative to the external clock signal.

23. A method for providing timing signals in an integrated circuit coupled to an external clock signal, comprising the steps of:
generating a reference voltage signal using a phase lock loop circuit coupled to the external clock signal and resident in the integrated circuit, the reference voltage signal comprising an analog representation of the external clock signal, the external clock signal comprising a digital signal, comprising the steps of:
generating a feedback signal using a voltage controlled oscillator coupled to the reference voltage signal;
comparing the phase of the external clock signal with the feedback signal to generate a series of digital pulses;
converting the series of digital pulses into an analog voltage signal using a loop filter circuit; and
biasing the analog voltage signal to generate the reference voltage signal;
transmitting the reference voltage signal to a remote timing element resident in the integrated circuit; and generating a digital timing signal in the remote timing element selectively synchronized with the external clock signal responsive to the receipt of the reference voltage.

24. The method of claim 23 wherein said step of generating a reference voltage comprises the step of:

shaping the signals of the external clock signal and the feedback signal prior to said step of comparing such that the signals have substantially identical waveforms and duty cycles.

25. The method of claim 23 wherein said step of generating a feedback signal comprises the step of repeatedly charging and discharging a reference capacitor.

26. The method of claim 25 wherein said step of generating a digital timing signal comprises the step of charging a remote capacitor resident in the remote timing element, the remote capacitor proportionally sized with respect to the reference capacitor.

* * * * *